(12) United States Patent
Hyoudo et al.

(10) Patent No.: US 6,365,433 B1
(45) Date of Patent: Apr. 2, 2002

(54) SEMICONDUCTOR DEVICE AND MANUFACTURING METHOD THEREOF

(75) Inventors: Haruo Hyoudo; Shigeo Kimura, both of Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/557,964

(22) Filed: Apr. 25, 2000

(30) Foreign Application Priority Data

Apr. 27, 1999 (JP) .......................................... 11-120427

(51) Int. Cl.[7] .......................... H01L 21/44; H01L 29/00
(52) U.S. Cl. ...................... 438/106; 438/109; 438/117; 438/123; 438/149; 438/668; 257/529; 257/784
(58) Field of Search ................................. 438/106, 121, 438/123, 127, 109, 117, 618, 149, 630, 668, 29, 27, 411, 108, 119; 257/529, 784, 355, 698, 737

(56) References Cited

U.S. PATENT DOCUMENTS 5,027,255 A * 6/1991 Zeitlin et al. ................ 361/395
6,285,067 B1 * 9/2001 Hyoundu et al. ........... 257/529

* cited by examiner

Primary Examiner—Matthew S. Smith
Assistant Examiner—Igwe U. Anya
(74) Attorney, Agent, or Firm—Wenderoth, Lind & Ponack, L.L.P.

(57) ABSTRACT

A semiconductor device having an overcurrent protection element therein is provided. The device comprises: a substrate having first and second main surfaces; a semiconductor chip fixed to the first main surface of the substrate; a fuse element fixed to the first main surface of the substrate; a cover member fixed to the substrate for sealing the semiconductor chip and the fuse element in an airtight space; and external connecting terminals formed on the second main surface of the substrate.

11 Claims, 5 Drawing Sheets

SEMICONDUCTOR DEVICE AND MANUFACTURING METHOD THEREOF

BACKGROUND OF THE INVENTION

1. Field of the Invention

The present invention relates to a semiconductor device incorporating an overcurrent protection device for cutting off electrical current to an electronic component when the current is slightly higher than the rated current for the component.

2. Description of the Prior Art

Overcurrent protection devices are often installed in electronic equipment to prevent electronic components in the equipment from being damaged due to overcurrents, or power sources being connected in reverse. Generally, these overcurrent protection devices are formed of a fuse element, which is designed to melt just before the current becomes large enough to damage an electronic component. Older fuse elements were sealed in a glass tube. Newer fuse elements were sealed in resin, such as those prescribed in Japanese laid-open utility model publication 57-46615.

FIG. 1 shows a resin-sealed overcurrent protection device. The device includes a pair of leads 1 and 2; a fine wire 3 made of gold, silver, or the like and connected between the leads 1 and 2 by wire bonding; and a nonflammable resin 4 surrounding the leads 1 and 2 and housing the fine wire 3. The resin 4 is formed of a silicon resin or the like, which is injection-molded. The fine wire 3 has a diameter of approximately 30 $\mu$m and serves as a fuse element, using the relationship between its diameter and fusing current.

However, although the resin 4 is said to be nonflammable, it can emit sparks and smoke or cause color change due to heat generated when the fine wire 3 melts. If the overcurrent protection device catches fire and affects the equipment, the device loses its reliability, because the device is designed to protect the equipment.

With the increased use of portable electronic equipment that use batteries for power sources, such as cellular telephones, it is necessary to implement measures for dealing with batteries connected in reverse during installation. In these cases, an overcurrent protection element is essential. However, employing these elements in portable electronic equipment tends to make the equipment larger, while the goal is to make the equipment lighter, thinner, and smaller all around.

Further, with the recent trend toward smaller and lighter products, efforts are being required to contain multiple functions in a single package and, in particular, to house the above-described overcurrent protection function in a semiconductor device.

SUMMARY OF THE INVENTION

In view of the foregoing, it is an object of the present invention to provide a semiconductor device and a manufacturing method thereof, which incorporate an overcurrent protection element that does not emit sparks or smoke or cause the device to change color or shape when the fuse element melts.

To achieve the object of the present invention, there is provided a semiconductor device comprising: a substrate having first and second main surfaces; a semiconductor chip fixed to the first main surface of the substrate; a fuse element fixed to the first main surface of the substrate; a cover member fixed to the substrate for sealing the semiconductor chip and the fuse element in an airtight space; and external connecting terminals formed on the second main surface of the substrate.

According to a second aspect of the present invention, there is provided a method of manufacturing a semiconductor device comprising: preparing a common substrate having opposing first and second main surfaces, the first main surface having a plurality of mounting sections; fixing a semiconductor chip and a fuse element on each of the mounting sections; fixing a cover member on the first main surface that spans the plurality of mounting sections and seals each of the semiconductor chips and the fuse elements in an airtight space; and separating the cover member and the substrate for each mounting section to obtain individual semiconductor devices, each device having the semiconductor chip and the fuse element sealed in an airtight space.

The above and other objects, features, and advantages of the present invention will become apparent from the following description when taken in conjunction with the accompanying drawings which illustrates preferred embodiments of the present invention by way of example.

DETAILED DESCRIPTION OF THE PREFERRED EMBODIMENTS

Figure 2A:
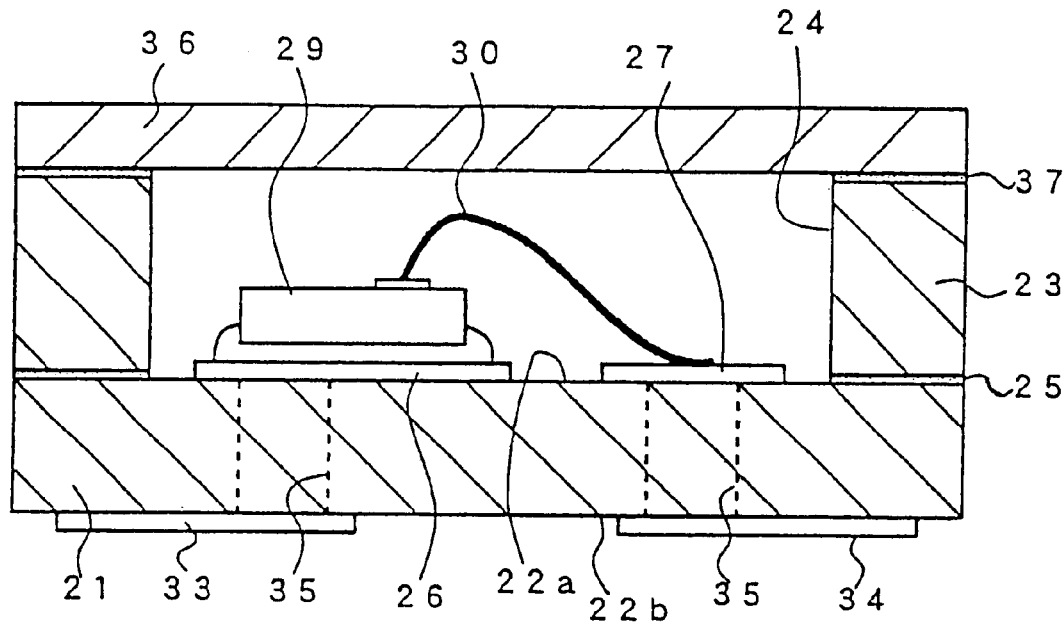
FIGS. 2A and 2B are a cross-sectional view and a plan view respectively showing a semiconductor device according to an embodiment of the present invention.
Figure 2B:
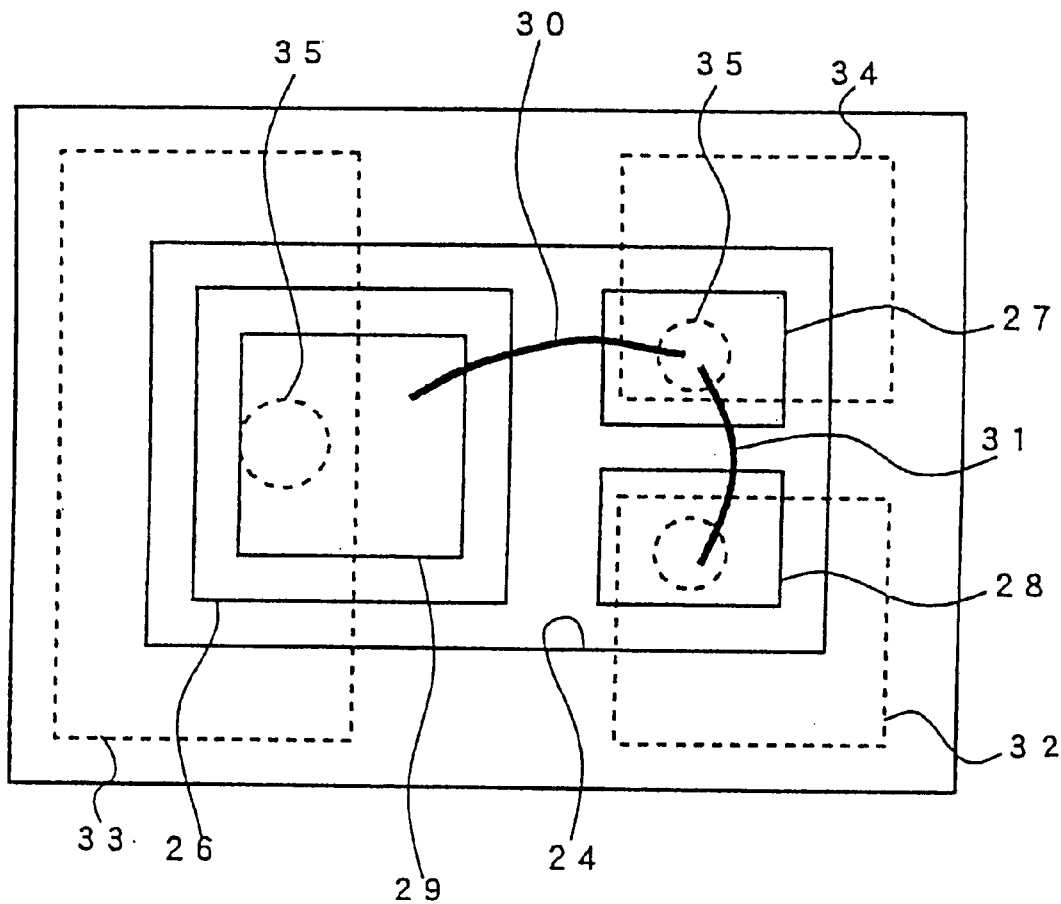

A semiconductor device according to preferred embodiments of the present invention will be described while referring to the accompanying drawings. FIGS. 2A and 2B include a cross-sectional view and a plan view showing a semiconductor device having an overcurrent protection device according to an embodiment of the present invention.

A substrate 21 shown in FIG. 2A is formed of an insulating material, such as ceramic or a glass epoxy, and has a thickness of 250–350 $\mu$m. When looking at the plan view in FIG. 2B, the substrate 21 has a rectangular shape with approximate dimensions of 1.5 mm×2.5 mm. The substrate 21 has a first main surface 22a at its top surface and a second main surface 22b at its bottom surface. The two main surfaces 22a and 22b are parallel with each other. A framework 23 has a height of 0.4 mm and a width of 0.5 mm and is disposed on the periphery portion of the substrate 21, forming a depression 24 for enclosing elements in the center of the substrate 21. The substrate 21 and framework 23 are formed separately and fixed together with an adhesive 25. However, the substrate 21 and framework 23 can also be provided as one integrally formed part.

An island section 26 and electrodes 27 and 28 are formed on the first main surface 22a by a conductive pattern of gold plating or the like. A semiconductor chip 29 such as a Schottky barrier diode or the like is die-bonded to the island section 26. An electrode pad (not shown) formed on the surface of the semiconductor chip 29 is connected to the electrode 27 by a bonding wire 30. A fuse element is formed between the electrodes 27 and 28 by wire bonding, and comprises a fine wire 31 having a diameter of approximately 30 μm. The fine wire 31 is formed of gold wire having a purity of 99.99% and fine solder wire or the like. The fine wire 31 is first bonded to the electrode 27 and next bonded to the electrode 28, while forming a loop in the wire having a height contained below the height of the depression 24. The diameter of the fine wire 31 is smaller than that of the bonding wire 30.

External connectors 32, 33, and 34 are formed on the second main surface 22b of the substrate 21 by conductive patterns formed of gold plating or the like. Via holes 35 corresponding to each of the external connectors 32, 33, and 34 penetrate the substrate 21 from the first main surface 22a to the second main surface 22b. The via holes 35 are filled with a conducting material such as tungsten, electrically connecting the island section 26 to the external connector 33, the electrode 27 to the external connector 34, and the electrode 28 to the external connector 32. The edges of the external connectors 32, 33, and 34 are set back approximately 0.1–0.2 mm from the edges of the substrate 21. It is desirable that the bonding wire 30 and fine wire 31 to be connected to the electrodes 27 and 28 are bonded directly above the via holes 35.

A cover member 36 formed of a ceramic plate having a thickness of approximately 0.15–0.25 mm is fixed by an adhesive 37 to the top surface of the framework 23 such that the depressions 24 become airtight. As a result, the semiconductor chip 29 and fine wire 31 are enclosed within a completely airtight space. The cover member 36 and framework 23 can also be constructed as one integrally formed unit.

The semiconductor device described above is mounted such that the external connectors 32, 33, and 34 are bonded directly opposite to the electrode patterns on the top surface of the printed circuit board. One electrode (cathode) of the semiconductor chip 29 is electrically connected to the external connector 33 via the island section 26 and via holes 35, while the other electrode (anode) is electrically connected to the external connector 34 via the bonding wire 30 and via hole 35. Also, electrode 27 is electrically connected to electrode 28 by fine wire 31. One end of the fine wire 31 connects to the external connector 34, while the other connects to the external connector 32. The external connector 33 can also be used as an anode terminal in order to connect the semiconductor chip 29 and fuse element on separate circuits.

If a current larger than the rated current flows between the external connectors 32 and 34, flowing through the fine wire 31, the current will generate an abrupt rise in temperature in the fine wire 31 due to the specific resistance in the fine wire 31. As a result, the fine wire 31 will melt by the generated heat, thereby performing its function to protect against overcurrents. Accordingly, the fine wire 31 should be extremely fragile against overcurrent and designed to melt at the correct temperature. The melting current for the gold wire described above having a diameter of 30 μm is approximately 4 A (over 1–5 seconds). In most cases, the fine wire 31 melts at a point near its center, rather than near the electrodes 32 and 34, due to the relationship between heat radiation and resistance.

Since the point of the wire that melts is not in contact with resin or any other material, the device will not emit sparks or smoke or cause the device to change in color or shape. Further, when the fine wire 31 melts to become discontinuous due to an overcurrent, the circuit between the terminals becomes completely open.

As an alternative to the fine wire 31, the fuse element can be configured by a conductive pattern, wherein a portion of the conductive pattern connecting the electrodes 32 and 34 in series is formed like a narrow wedge. Another alternative, is to configure the fuse element with a polysilicon resistor. In either case, the area subject to melting must be enclosed within the depression 24. Further, the sealed depression 24 contains only air. However, the depression 24 can also be filled with a noncombustible gas, such as nitrogen and the like.

The external connectors 32 and 34 that are provided on either end of the fine wire 31 facilitate a determination of the cause of failure. For example, after a breakdown occurs in a device, it is possible to determine without opening the device whether failure of the semiconductor chip or melting of the fuse element caused the breakdown.

Figure 1:
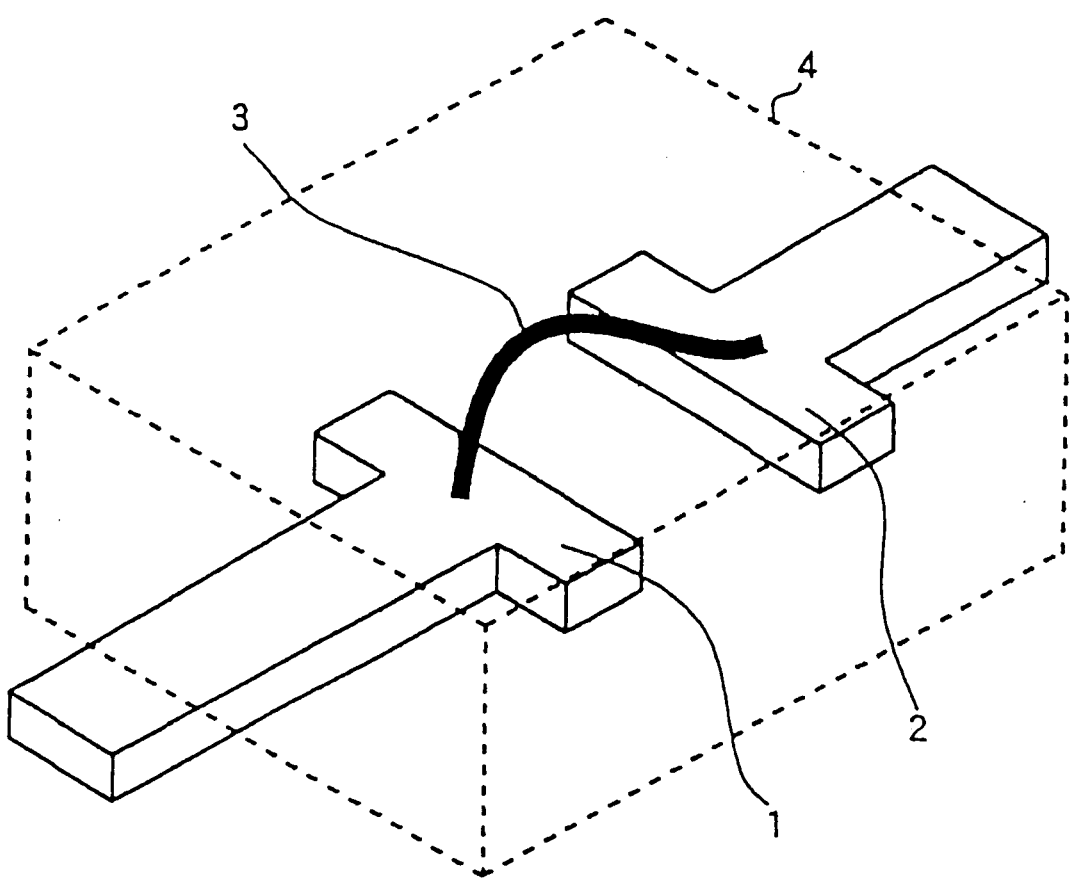
FIG. 1 is a perspective view showing a conventional overcurrent protection device.

FIGS. 3A, 3B, 4A and 4B are provided for describing the method of manufacturing the semiconductor device of FIG. 1. In this example, the framework 23 is fixed to the substrate 21.

Figure 3A:
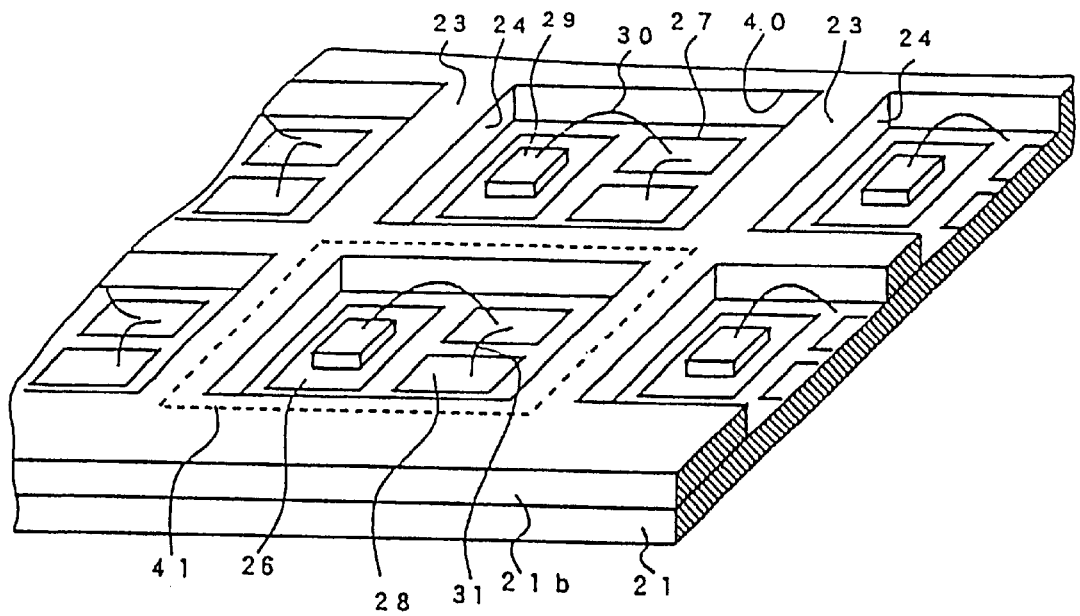
FIGS. 3A and 3B are perspective views showing steps of manufacturing the semiconductor device as shown in FIGS. 2A and 2B.

Step 1: see FIG. 3A

First, the large substrate 21 is prepared. A plurality of groups each including the island section 26 and the pair of electrodes 27 and 28 is formed on the first main surface 22a. A second substrate 21b is fixed to the first main surface 22a. The substrate 21b is shaped like a mesh comprising the framework 23 and a plurality of through-holes 40 therein. When the substrate 21b is fixed to the first main surface 22a, the through-holes 40 expose each of the groups of the island section 26 and electrodes 27 and 28 and form the depressions 24, which are each surrounded by the framework 23. Each depression 24 and a portion of the framework 23 surrounding each depression 24 constitute a mounting section 41 for a semiconductor chip and a fuse element.

After preparing the substrate 21 as described above, one semiconductor chip 29 is die-bonded to each island section 26 in each depression 24. The bonding wire 30 is wire-bonded between the semiconductor chip 29 and the electrode 27 and the fine wire 31 is wire-bonded between electrodes 27 and 28 to form a fuse element. It is also possible to perform the wire bonding before fixing the substrate 21b to the substrate 21. When performing the process in this order, the die-bonding and wire-bonding processes are performed on a flat substrate 21. Accordingly, the framework 23 is not present during these processes to obstruct operations of an adsorption collet or a bonding tool, enabling the dimensions of the depressions 24 to be reduced as a result.

Figure 3B:
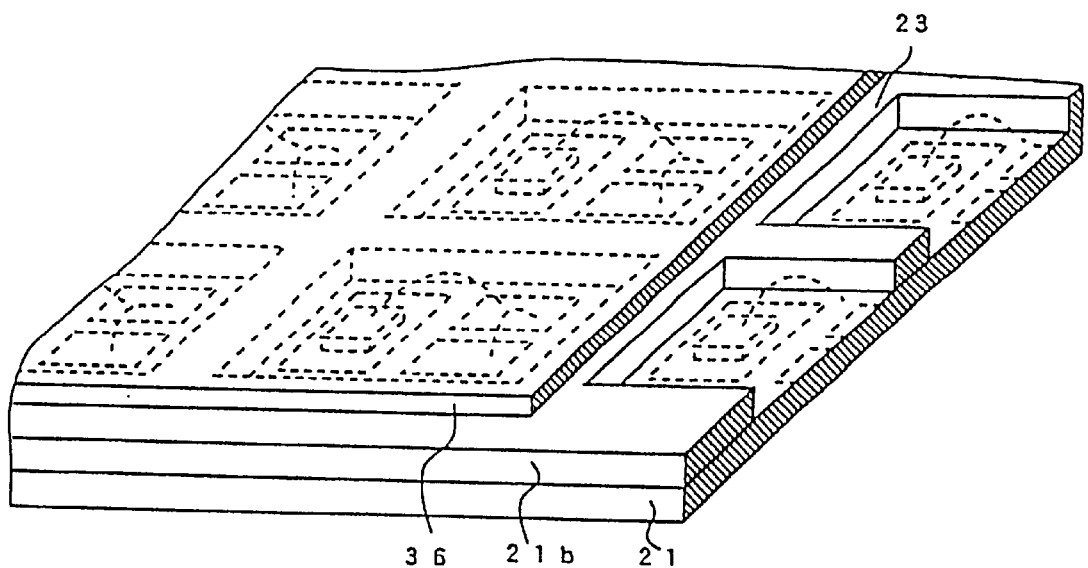

Step 2: see FIG. 3B

The cover member 36 is fixed on the framework 23 spanning all over the plurality of mounting sections 41 to hermetically seal the plurality of depressions 24. A glass type or epoxy type adhesive is used to fix the cover member 31 to the substrate 21b.

Figure 4A:
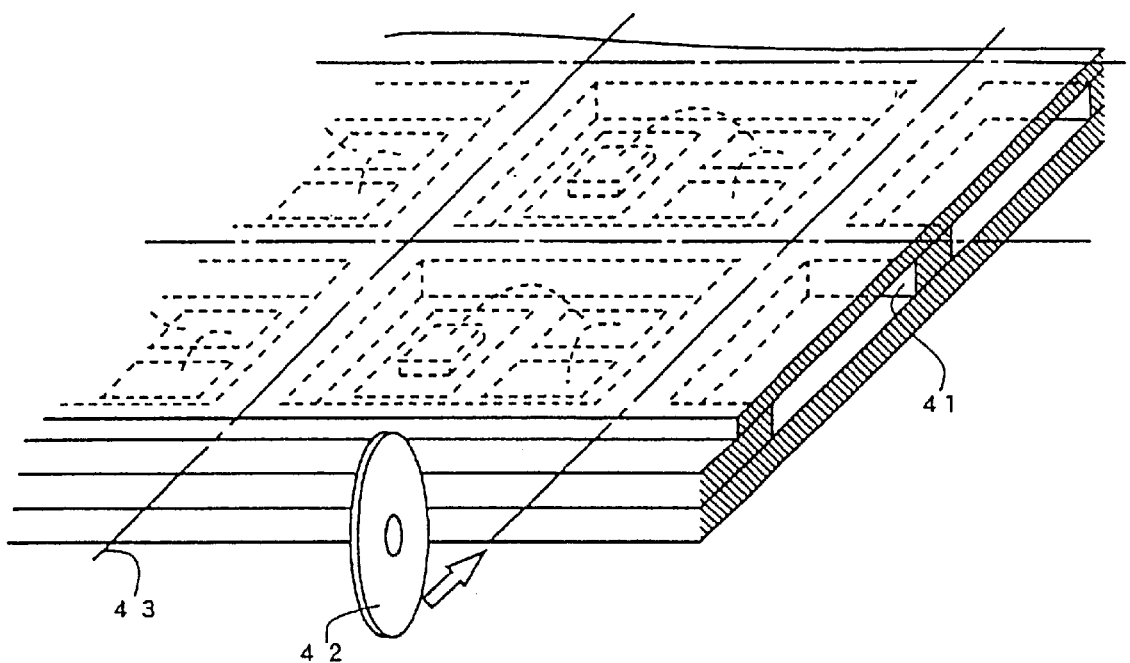
FIGS. 4A and 4B are perspective views showing steps of manufacturing the semiconductor device as shown in FIGS. 2A and 2B.

Step 3: see FIG. 4A

Figure 4B:
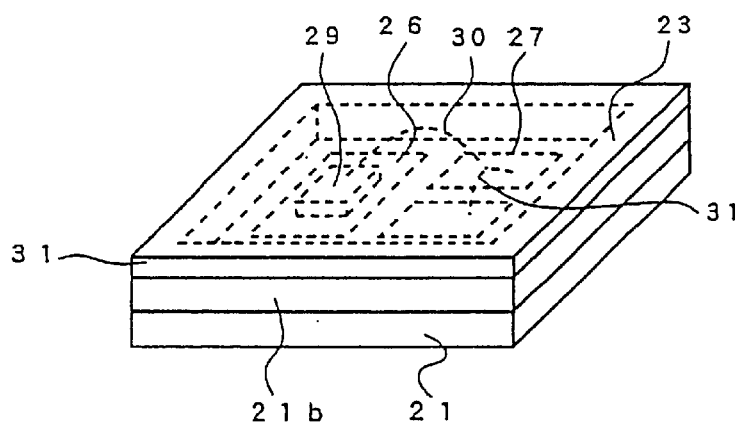

Each of the mounting sections 41 is separated by cutting along the guide marks formed on the surface of the substrate 21. A dicing blade 42 is used to separate the mounting sections 41. The process is conducted by fixing a dicing sheet to the bottom surface of the substrate 21 and cutting through the substrates 21 and 21b along longitudinal and latitudinal dicing lines 43 using the dicing blade 42. The dicing lines 43 are positioned along the center of the framework 23. An individual device separated from the substrates 21 and 21b is shown in FIG. 4B.

The manufacturing method according to another embodiment of the present invention will be described with reference to FIGS. 5A, 5B, wherein like parts and components are designated by the same reference numerals to avoid duplicating description.

Figure 5A:
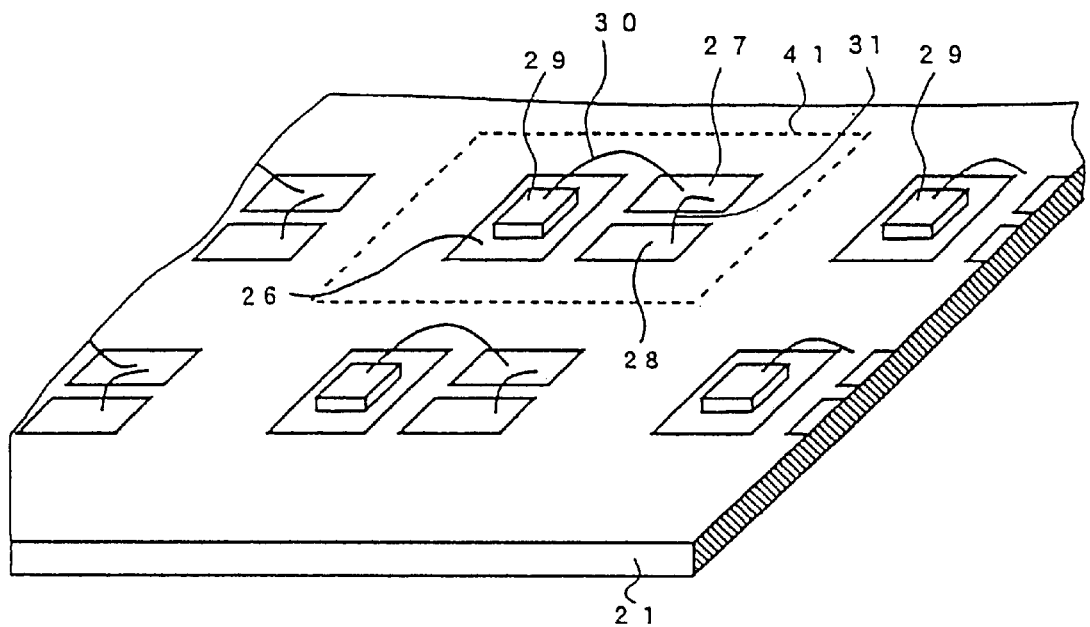
FIGS. 5A and 5B are perspective views showing steps of manufacturing the semiconductor device, according to another embodiment of the invention.
Figure 5B:
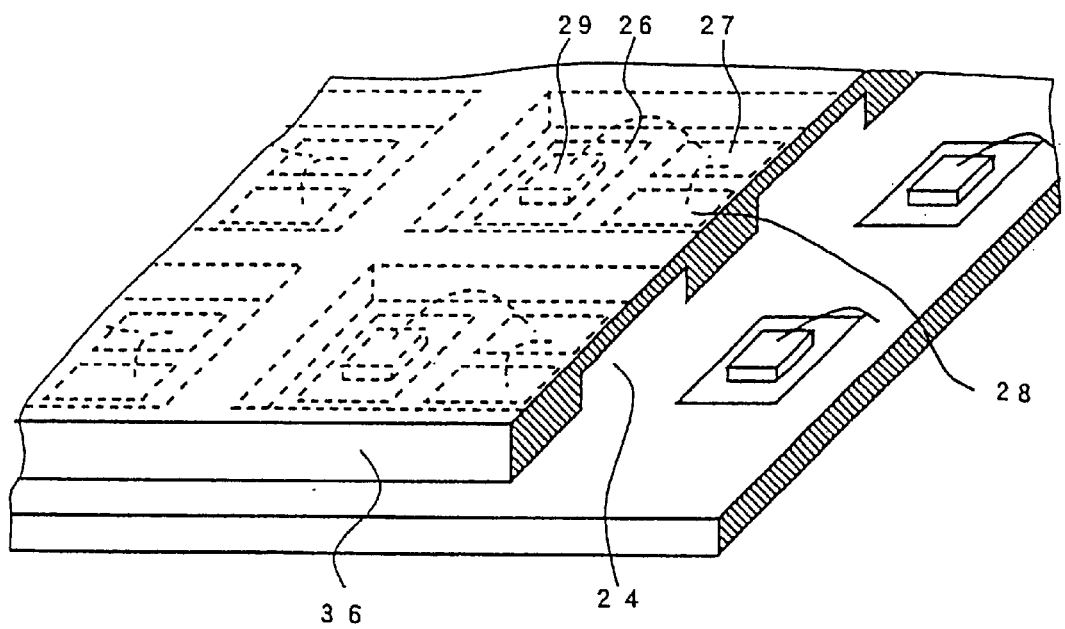

As shown in FIG. 5A, a flat substrate 21 has a plurality of mounting sections 41, where each mounting section has an island section 26 and a couple of electrodes 27, 28. Semiconductor chips 29 are die-bonded to the island sections 26 and fine wires 31 are wire-bonded between the electrodes 27 and 28 on the substrate 21. As shown in FIG. 5B, a cover member 36 having a plurality of depressions 24 corresponding to each of the mounting sections 41 is fixed to the substrate 21.

The manufacturing processes described above in both embodiments enable a plurality of devices to be manufactured simultaneously. These processes are simpler and can achieve a smaller package size than when packaging each device individually.

In the embodiments described above, the fuse element is enclosed in an airtight hollow package. Accordingly, it is possible to obtain an overcurrent protection device that does not emit sparks or smoke or cause the device to change color or shape when the fuse element melts. Further, the external connectors 32, 33, 34 do not protrude externally from the device, allowing its mounting surface to be greatly reduced for mounting in an overcurrent protection device and a semiconductor device.

As described above, the semiconductor chip and the fuse element are integrated to improve the efficiency of mounting elements in electronic equipment.

As described above, the external connectors 32 and 34 are provided on both ends of the fuse element. Accordingly, the same effects can be obtained whether the semiconductor chip 29 and fuse elements are connected in series or parallel. This configuration also facilitates determining the cause of a failure.

As described above, a plurality of elements are manufactured simultaneously on a common substrate and subsequently cut into individual electronic devices. This process helps to reduce production costs and produces a cheaper and smaller electronic device.

Although certain preferred embodiments of the present invention have been shown and described in detail, it should be understood that various changes and modifications may be made therein without departing from the scope of the appended claims.

What is claimed is:

1. A semiconductor device comprising:
   a substrate having first and second main surfaces;
   a semiconductor chip fixed to the first main surface of the substrate;
   a fuse element fixed to the first main surface of the substrate;
   a cover member fixed to the substrate for sealing the semiconductor chip and the fuse element in an airtight hollow space; and
   external connecting terminals formed on the second main surface of the substrate.

2. A semiconductor device as claimed in claim 1, wherein the fuse element comprises a bonding wire.

3. A semiconductor device as claimed in claim 1, further comprising:
   via holes formed in the substrate for electrically connecting the semiconductor chip and the fuse element to the external connecting terminals.

4. A semiconductor device as claimed in claim 1, wherein the semiconductor chip comprises a diode element.

5. A semiconductor device as claimed in claim 1, wherein the external connecting terminals are electrically connected to both ends of the fuse element respectively.

6. A method of manufacturing a semiconductor device comprising:
   preparing a common substrate having opposing first and second main surfaces, the common substrate having a plurality of mounting sections;
   fixing a semiconductor chip and a fuse element on each of the mounting sections;
   fixing a cover member on the first main surface that spans the plurality of mounting sections and seals each of the semiconductor chips and the fuse elements in an airtight hollow space; and
   separating the cover member into individual cover member sections and the substrate into individual ones of the mounting sections to obtain individual semiconductor devices, said semiconductor devices having the semiconductor chips and the fuse elements respectively sealed in the airtight hollow spaces.

7. A method of manufacturing a semiconductor device as claimed in claim 6, wherein each mounting section has a depressed section that is surrounded by a framework section.

8. A method of manufacturing a semiconductor device as claimed in claim 7, wherein the substrate comprises a flat plate member and a framework member having holes therein fixed on the flat plate member, thereby forming depressed sections on the substrate.

9. A method of manufacturing a semiconductor device as claimed in claim 6, wherein the cover member has a frame member having depressions therein and the cover member is fixed on the common substrate so as to enclose the semiconductor chips and the fuse elements in the depressions airtightly.

10. A method of manufacturing a semiconductor device as claimed in claim 6, wherein the separating of the cover member into individual cover member sections and the substrate into individual ones of the mounting sections comprises a dicing process.

11. A method of manufacturing a semiconductor device as claimed in claim 10, wherein said airtight hollow spaces are partially defined by depressions formed in one of said cover member and said substrate, and the dicing process comprises cutting said cover member and said substrate approximately centrally between said depressions.

* * * * *